(12) United States Patent
Aarskog

(10) Patent No.: US 10,039,205 B2
(45) Date of Patent: Jul. 31, 2018

(54) SUBSEA POWER SUPPLY ARRANGEMENT

(71) Applicant: Siemens Aktiengesellschaft, Munich (DE)

(72) Inventor: Fredrik Gundersen Aarskog, Trondheim (NO)

(73) Assignee: SIEMENS AKTIENGESLLSCHAFT, Munich (DE)

( * ) Notice: Subject to any disclaimer, the term of this patent is extended or adjusted under 35 U.S.C. 154(b) by 58 days.

(21) Appl. No.: 15/103,895

(22) PCT Filed: Feb. 27, 2015

(86) PCT No.: PCT/EP2015/054119
§ 371 (c)(1),
(2) Date: Jun. 13, 2016

(87) PCT Pub. No.: WO2015/154916
PCT Pub. Date: Oct. 15, 2015

(65) Prior Publication Data
US 2017/0055358 A1 Feb. 23, 2017

(30) Foreign Application Priority Data

Apr. 7, 2014 (EP) .................................. 14163737

(51) Int. Cl.
*H05K 7/20* (2006.01)
*H02B 1/56* (2006.01)
(Continued)

(52) U.S. Cl.
CPC ............. *H05K 7/1432* (2013.01); *H02B 1/28* (2013.01); *H02B 1/32* (2013.01); *H02B 1/565* (2013.01);
(Continued)

(58) Field of Classification Search
CPC .. H05K 7/1432; H05K 7/209; H05K 7/20927; H02K 11/33; H02B 1/28; H02B 1/32; H02B 1/565; H02P 27/06
See application file for complete search history.

(56) References Cited

U.S. PATENT DOCUMENTS 4,106,068 A * 8/1978 Flanagan ................. H01G 2/14
 361/15
9,666,367 B2 * 5/2017 Aarskog ................. H01G 4/015
(Continued)

FOREIGN PATENT DOCUMENTS

EP 2048928 A2 4/2009
EP 2579438 A1 4/2013
(Continued)

OTHER PUBLICATIONS

Extended European Search Report dated Oct. 1, 2014.

*Primary Examiner* — Robert J Hoffberg
*Assistant Examiner* — Hung Dang
(74) *Attorney, Agent, or Firm* — Harness, Dickey & Pierce, P.L.C.

(57) ABSTRACT

A subsea power supply arrangement includes a closed power supply module realized to contain a pressure-compensated main fluid volume; and a number of power cell arrangements arranged in the interior of the closed power supply module. At least one power cell arrangement includes a metal capacitor housing realized to contain a capacitor bank in a fluid volume, and a barrier between an interior fluid volume of the power cell arrangement and the main fluid volume. A subsea power cell arrangement for use in such a subsea power supply arrangement is also disclosed.

20 Claims, 4 Drawing Sheets

(51) Int. Cl.
    *H05K 7/14*          (2006.01)
    *H02K 11/33*       (2016.01)
    *H02B 1/28*         (2006.01)
    *H02B 1/32*         (2006.01)
    *H02P 27/06*       (2006.01)

(52) U.S. Cl.
    CPC .............. *H02K 11/33* (2016.01); *H02P 27/06* (2013.01); *H05K 7/209* (2013.01); *H05K 7/20927* (2013.01)

(56) References Cited

U.S. PATENT DOCUMENTS

| | | | |
|---|---|---|---|
| 2010/0208415 A1* | 8/2010 | Bo | H01G 2/103 |
| | | | 361/521 |
| 2010/0208446 A1 | 8/2010 | Lapassat et al. | |
| 2013/0175041 A1* | 7/2013 | Nellessen, Jr. | E21B 33/0355 |
| | | | 166/336 |
| 2015/0223366 A1* | 8/2015 | Horiuchi | H02M 7/003 |
| | | | 361/689 |
| 2015/0292304 A1* | 10/2015 | Sneisen | H05K 7/1432 |
| | | | 429/6 |

FOREIGN PATENT DOCUMENTS

| | | | |
|---|---|---|---|
| EP | 2666956 A1 | 11/2013 | |
| WO | WO 2006019307 A1 | 2/2006 | |
| WO | WO 2008055515 A1 | 5/2008 | |

\* cited by examiner

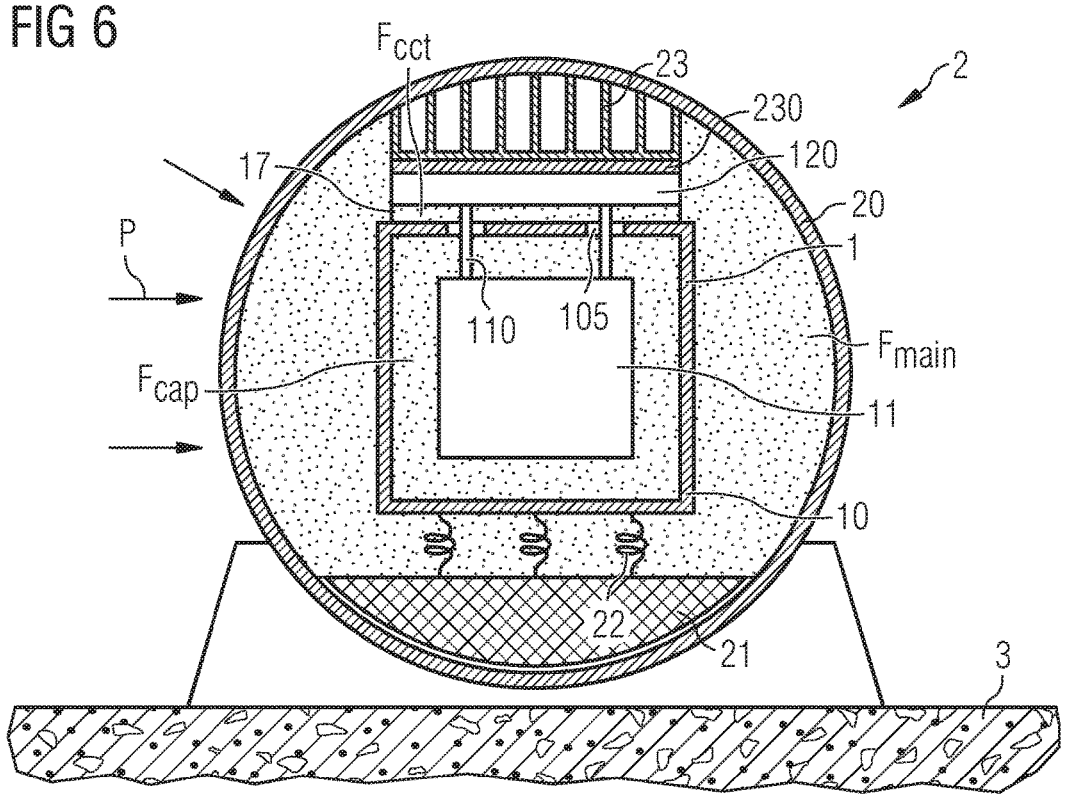
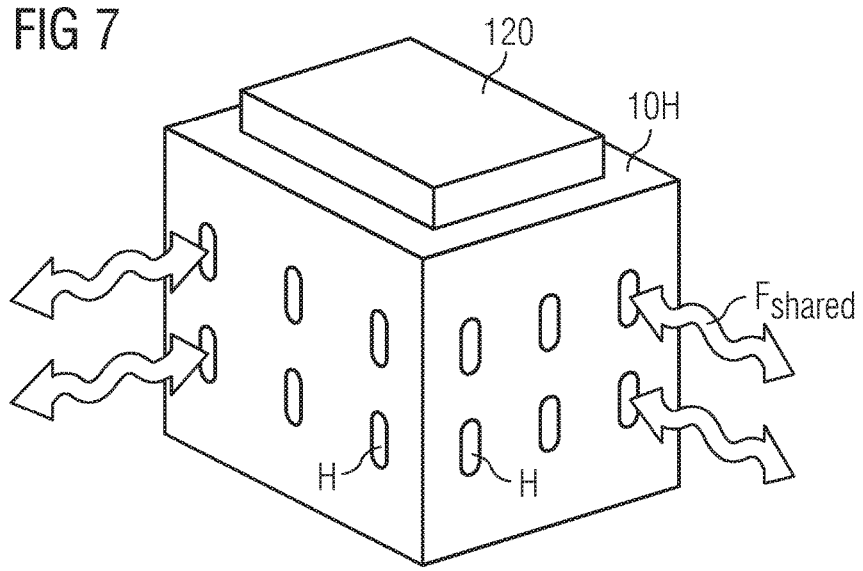

SUBSEA POWER SUPPLY ARRANGEMENT

PRIORITY STATEMENT

This application is the national phase under 35 U.S.C. § 371 of PCT International Application No. PCT/EP2015/054119 which has an International filing date of Feb. 27, 2015, which designated the United States of America and which claims priority to European patent application number EP14163737.1 filed Apr. 7, 2014, the entire contents of which are hereby incorporated herein by reference.

FIELD

An embodiment of invention generally relates to a subsea power supply arrangement and a subsea power cell arrangement.

BACKGROUND

Subsea power grids have been developed for supplying power to devices that are located on the seabed. For example, a compressor located on the seabed may be used to compress gas from an offshore gas field, so that the compressed gas can be pumped through a pipeline to an onshore destination, and the compressor can be supplied with power from a subsea power grid.

Generally, a subsea power supply such as a variable speed drive (VSD) will receive power over a fixed frequency AC transmission line. The variable speed drive converts the voltage, current and frequency into a level suitable for operating the machinery located on the seabed. Variable-speed drives (also called adjustable speed drives) can be preferred since these allow an efficient use of power in varying load situations. For example, a variable speed drive can be used to drive a compressor according to a fluctuating gas inflow level.

A variable speed drive usually contains several power cells. A power cell generally consists of a rectifier (comprising a number of diodes), a DC-link capacitor or re-chargeable battery, and an inverter (comprising several insulated gate bipolar transistors or IGBTs). It may thus also be termed converter cell. The inverter, whose outputs connect to a load, may typically be realized using an H-bridge configuration, so that a voltage can be applied across the load in either direction. In the VSD the supply voltage or input voltage is transformed down to a voltage suitable for the semiconductors, i.e. the diodes and IGBTs. The voltage is rectified to a DC voltage by the diode rectifier, which in turn is connected to the DC-link capacitor. The inverter module converts the power cell's DC output into an AC output voltage (usually single phase AC) for the load. Several of these power cells can be connected in series to increase the total available output voltage (and thus output power) of the VSD. One series-connected 'branch' of power cells is generally used for each output phase. For example, in a three-phase system, three such branches of series-connected power cells could be deployed.

An AC motor may be supplied with variable frequency AC voltage from a VSD. Power to the variable speed drive is supplied from the AC power supply, as described above. The components of a subsea power cell arrangement must be contained to avoid any contact with the underwater environment, and must also be able to withstand the pressure at the point of installation, usually the seabed. For example, the pressure at a depth of 3000 m is about $3\times10^7$ Pa. Therefore, to avoid material damage, the pressure inside a container placed at that depth should equal the pressure exerted on the container.

In prior art approaches, the interior volume of a variable speed drive is filled with dielectric fluid to achieve a pressure-compensated system. This main or shared fluid volume fills any spaces between elements of the power cells arranged in a housing of the variable speed drive and can enter into the housings of the power cells mounted inside the drive housing. The fluid volume is pressure-compensated to a pressure very close to the outside sea water pressure so that the housing is not exposed to a pressure difference or differential pressure and thus is not exposed to high forces exerted on it from outside.

The power cells of existing subsea arrangements are housed in polymer containers. While such a polymer container is relatively easy to form, it has a number of disadvantages. The polymer material must be compatible with the dielectric fluid (for example an ester-based dielectric fluid) used to fill the interior, but suitable polymers may be expensive and/or difficult to obtain. For example, polyisocyanurate can be difficult to produce with the necessary material quality and is therefore expensive, while polyurethane is incompatible with a favoured ester-based dielectric fluid.

Furthermore, a power cell enclosure made of such a polymer material lacks material strength and may deform over time, thus increasing the likelihood that the power cell will become damaged and fail. This leads to the additional problem that particles from a damaged power cell can spread through the variable speed drive and can enter into other power cells arranged in the shared fluid volume, thus increasing the likelihood that these will also fail.

Another problem associated with a polymer power cell enclosure is that such an enclosure may not be able to withstand shock and vibration tests. An enclosure must fulfil certain minimum test requirements in order to ensure that the power cell does not suffer damage during transportation and installation at the subsea site.

A power cell of a subsea power supply arrangement can fail in many ways. For example the semiconductors, capacitors or electrical conductors can short circuit. The cause of many of these failures is very often contamination in the power cell environment. Contaminations can originate from other components and solid materials in the VSD, for instance if a polymer material is not compatible with the surrounding fluid. These contaminations can easily spread throughout the shared fluid volume and can reduce the expected lifetime of other power cells and/or components. The reason for this is because a VSD is usually realized to have a built-in redundancy, by providing a number of additional or extra power cells for each output phase of a multi-phase system. For example, if four power cells are required in each phase to obtain the rated output power, the VSD can be realized to include five, six or more power cells so that, if one cell should fail, it can be bypassed or disconnected from the circuit, and one of the 'extra' power cells can take over its function. However, in the known designs, contamination from a failed power cell can be transported by the main fluid volume of the VSD and can enter the interior fluid volume of a functional power cell, and can thereby lead to the failure of that power cell also.

SUMMARY

An embodiment of the invention provides an improved subsea power supply arrangement that reduces/overcomes at least one of the problems outlined above.

An embodiment of the invention is directed to a subsea power supply arrangement. An embodiment of the invention is directed to a subsea power cell arrangement.

According to an embodiment of the invention, the subsea power supply arrangement, for example for use in a variable speed drive, comprises a closed power supply module realized to contain a pressure-compensated main fluid volume; and a number of power cell arrangements arranged in the interior of the closed power supply module, whereby a power cell arrangement comprises a metal capacitor housing realized to contain a capacitor bank in a fluid volume, and a barrier between an interior fluid volume of the power cell arrangement and the main fluid volume.

According to an embodiment of the invention, the subsea power cell arrangement is realized for use in such a subsea power supply arrangement, and comprises a metal capacitor housing realized to contain a capacitor bank in a fluid volume; a circuit module mounted to the metal capacitor housing; and a busbar arrangement mounted to the metal capacitor housing, characterized in that the power cell arrangement comprises a barrier between an interior fluid volume of the power cell arrangement and the main fluid volume of the subsea power supply arrangement.

Particularly advantageous embodiments and features of the invention are given by the dependent claims, as revealed in the following description. Features of different claim categories may be combined as appropriate to give further embodiments not described herein.

BRIEF DESCRIPTION OF THE DRAWINGS

Other objects and features of the present invention will become apparent from the following detailed descriptions considered in conjunction with the accompanying drawings. It is to be understood, however, that the drawings are designed solely for the purposes of illustration and not as a definition of the limits of the invention.

FIG. 6 shows a second embodiment of a subsea power cell arrangement according to the invention;

FIG. 7 shows an alternative embodiment of a capacitor enclosure.

In the diagrams, like numbers refer to like objects throughout. Objects in the diagrams are not necessarily drawn to scale.

DETAILED DESCRIPTION OF THE EXAMPLE EMBODIMENTS

Figure 1:
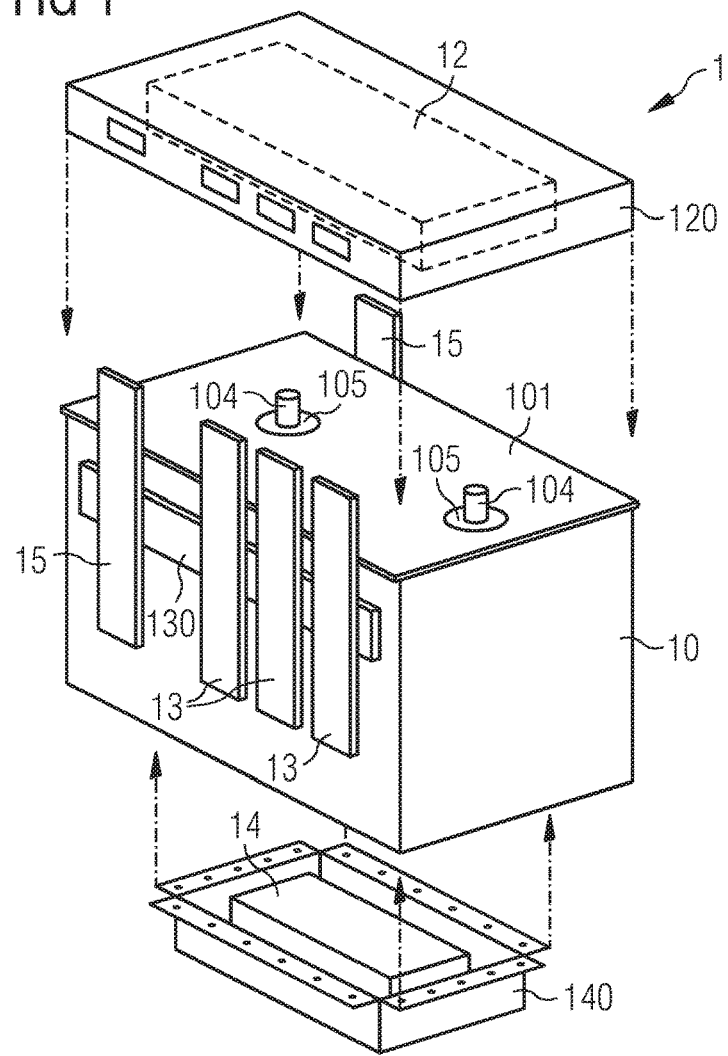
FIG. 1 shows a first embodiment of a subsea power cell arrangement according to the invention.

According to an embodiment of the invention, the subsea power supply arrangement, for example for use in a variable speed drive, comprises a closed power supply module realized to contain a pressure-compensated main fluid volume; and a number of power cell arrangements arranged in the interior of the closed power supply module, whereby a power cell arrangement comprises a metal capacitor housing realized to contain a capacitor bank in a fluid volume, and a barrier between an interior fluid volume of the power cell arrangement and the main fluid volume.

An advantage of the subsea power supply according to an embodiment of the invention is that the material strength of the capacitor housings favourably extends the lifetime of the power supply. Also, since the metal capacitor housings are smaller compared to polymer housings, the overall volume of the power supply can also be smaller, so that a smaller fluid volume is sufficient. This also contributes to the economical realisation of such a power supply. Another advantage of the subsea power supply according to the invention is that the metal capacitor housings can be maintained at a local ground potential, so that problems relating to electromagnetic interference (EMI) can be reduced or eliminated. Also, since the interior fluid volume of each power cell arrangement is separated from the main fluid volume, the likelihood of contamination passing from a failed power cell arrangement to a functional power cell arrangement is favourably reduced, so that the lifetime of the subsea power supply arrangement can be significantly extended.

According to an embodiment of the invention, the subsea power cell arrangement is realized for use in such a subsea power supply arrangement, and comprises a metal capacitor housing realized to contain a capacitor bank in a fluid volume; a circuit module mounted to the metal capacitor housing; and a busbar arrangement mounted to the metal capacitor housing, characterized in that the power cell arrangement comprises a barrier between an interior fluid volume of the power cell arrangement and the main fluid volume of the subsea power supply arrangement.

An advantage of the subsea power cell arrangement according to an embodiment of the invention is that a metal housing or enclosure is mechanically stronger than a polymer housing. Such a metal housing can be constructed to withstand the shock and vibration tests required of a subsea power cell enclosure. Also the metal housing is less prone to sagging, softening, swelling and other types of deformation that could easily occur in a polymer material. Another advantage is that the overall size and volume of the power cell arrangement can be reduced, since a metal housing can have low material thickness compared to a polymer housing. Any suitable kind of metal can be used, for example a relatively cheap sheet metal that is easy to source, and which can be formed with relatively little effort, while being strong enough to retain its shape and to withstand high pressures.

A barrier between the interior fluid volume and the exterior fluid volume can be permeable, semi-permeable, or solid. For example, a barrier may be realized as a filter membrane that allows passage of the fluid between the interior and the exterior of the power cell arrangement, but which is fine enough to prevent particles from passing the barrier. Alternatively, a barrier may be solid, for example in the form of a closed housing of the power cell arrangement. The power cell arrangement according to the invention can comprise any number of barriers, and each of these can be realized as appropriate. An advantage of the subsea power cell arrangement according to the invention is that it can ensure true redundancy in a system comprising a number of such power cell arrangements, since any fluid volume contained in the power cell arrangement can be protected from contamination, thereby favourably extending the lifetime of the power cell arrangement. Similarly, any contamination originating from this power cell arrangement (for example in the event of failure of a diode) can be prevented from spreading to another power cell arrangement. In this way, a failure of one power cell arrangement will not affect the reliability of other power cell arrangements in that system.

Particularly advantageous embodiments and features of the invention are given by the dependent claims, as revealed in the following description. Features of different claim categories may be combined as appropriate to give further embodiments not described herein.

In the following, without restricting embodiments of the invention in any way, it may be assumed that the subsea power supply is realized as a variable speed drive to supply power to a motor, for example for supplying power to a device such as a pump, a compressor, etc. It may further be assumed that the input power to the power supply originates from an AC transmission line from an onshore grid or substation. A variable speed drive can comprise any number of power cell arrangements according to an embodiment of the invention. For example, a variable speed drive for supplying power to a subsea compressor or subsea pump can be realized to use eighteen such power cell arrangements.

The term "DC-link" refers to the DC electrical connection between the rectifier and the inverter. Since this part of the circuit comprises the capacitor stack of the power cell, the terms "DC-link capacitor", "capacitor stack" and "capacitor bank" may be used interchangeably herein. Also, again without restricting the invention in any way, the fluid used in the subsea power cell arrangement may be assumed to be a dielectric oil, and the terms "fluid", "oil", and "dielectric fluid" may be used interchangeably in the following.

The power cell may be termed converter cell. In an embodiment, the power cell may comprise a rectifier (which may comprise a number of diodes), a DC-link capacitor or re-chargeable battery, and an inverter (which may comprise several insulated gate bipolar transistors or IGBTs). The inverter, the outputs of which may connect to a load, may be realized using an H-bridge configuration, so that a voltage can be applied across the load in either direction.

Power is generally transported to and from the power cells over busbars. For example, in the case of a power cell with a 3-phase AC input, three busbars will be connected to a diode module, for example a three-phase full-wave bridge rectifier, for rectification to DC. The DC rectified output of the diode module is used to charge the DC-link capacitor, and is connected to this by two busbars, which also connect to the inputs of an IGBT H-bridge. The output of the H-bridge is realized for connection to the load. A busbar is usually made of metal such as copper, brass or aluminium and has a cross-sectional area chosen to carry the desired level of current. A busbar is typically relatively wide and flat so that it can effectively dissipate heat. In an example embodiment of the invention, the power cell arrangement comprises a number of insulating spacer elements between the busbars and the metal capacitor housing. Such a spacer is preferably made of a glass fibre reinforced epoxy material, which is relatively easy to form and which can offer the necessary electrical insulation. For example, the thickness and density of the spacers can preferably be made to withstand voltages exceeding 6.0 kV.

In a power cell such as the type described herein, AC/DC power conversion is generally done using a rectifier circuit comprising diodes as explained above, and the output power modulation is generally done using insulated gate bipolar transistors (IGBTs) in an H-bridge configuration. These components are generally arranged in a circuit module that is mounted to the capacitor housing. The components are also surrounded by the dielectric fluid that fills the interior of the power supply arrangement.

In an embodiment of the invention, the circuit module contains a circuit module fluid volume that is separated from the capacitor housing fluid volume and the main VSD fluid volume by a barrier. Such a barrier can comprise protective plates that deter particles from passing between the circuit module and the main fluid volume, for example in the case of failure of the circuit module or a power cell. More preferably, the barrier comprises a filter membrane. Such a filter membrane can prevent particles from passing between the circuit module and the main fluid volume, and protects the sensitive IGBTs and diodes from any contamination that might be present in the main fluid volume. Similarly, the power cells are protected from any particle contamination that might arise if a circuit module should fail. The use of such filters can greatly increase the reliability of the overall power supply.

A busbar (on the outside of the capacitor housing) is electrically connected to the AC connections of the rectifier diode module. The DC connections of the rectifier diode module are connected to the IGBTs via low inductance busbars. The DC-link capacitor is connected to the low inductance busbars via penetrators that penetrate the capacitor housing.

As power conversion is performed by a power cell, heat develops in the power cell's circuit module and should be transported away from the power cell in order to protect this from heat damage. Therefore, in an example embodiment of the invention, the power cell arrangement comprises a heat dissipating element such as a heat sink mounted to an outer surface of the housing of the circuit module. The heat sink transfers heat from the circuit module to the main fluid volume surrounding the power cell.

The DC-link capacitor, which is enclosed inside the metal capacitor housing, will also produce some heat. The power loss in the capacitors is relatively low, so that an increase in temperature owing to the closed capacitor housing may be expected to be limited to only a few Kelvin. Since the metal housing itself is a favourably effective dissipater of heat, the metal housing itself can suffice to effectively transfer heat to the main fluid volume.

Since the capacitor housing is made of metal, and the electrical potential of the housing is not necessarily equal to the potential of adjacent capacitor housings, these capacitor housings must be electrically isolated from each other. A capacitor housing must also be electrically isolated from any electrically conductive mechanical support with which it may be in contact. To this end, various epoxy spacers might be used to achieve the desired electrical isolation.

In an example embodiment of the invention, the capacitor housing comprises a closed structure realized to contain the capacitor housing fluid volume. Here, the term "closed structure" is to be understood to mean that the capacitor housing is essentially hermetically sealed so that any fluid inside the capacitor housing cannot escape. In such an embodiment, the capacitor housing preferably comprises one or more fluid inlet devices realized to allow the introduction of fluid, for example a dielectric oil or a dielectric ester, into the interior of the capacitor housing. For example, once the capacitor bank is placed inside the capacitor housing and this has been sealed, a quantity of fluid can be introduced into the housing. The power cell can now be tested and transported, ready for installation in a subsea power supply. Any oil on the outside can be wiped clean, to avoid dust particles from adhering to the outside of the capacitor enclosure.

When installed in the subsea power supply, the pressure of the main fluid volume may vary over time as pressure compensation is performed. Therefore, in a further embodiment of the invention, the capacitor housing also comprises a volume adjuster or volume compensation device realized to adjust the volume of the capacitor housing fluid volume in order to achieve pressure compensation between the fluid volume in the interior of the capacitor housing and an exterior fluid volume. Such a volume compensation device can be realized as a flexible membrane that can move inwards or outwards, according to a pressure difference. Such a volume compensation device can also be realized by designing the metal walls to be sufficiently flexible. The advantage of such a closed capacitor housing design is that the capacitor is protected from any contaminations that may be present in the main fluid volume during normal operation, so that a higher reliability of the capacitor is achieved. Also there is no need to provide fluid-filled or nitrogen-filled power cell transport boxes, which would otherwise be required to ensure that the capacitors do not become exposed to air. Allowing a capacitor bank to become exposed to air between manufacture and installation can greatly detract from the lifetime and performance of the power cell.

In an example embodiment of the invention, in the case of a closed capacitor housing, a busbar penetrator realized for a low differential pressure (e.g. one bar) is used to allow a low inductance busbar to extend from the capacitor bank to the outside through the metal housing. Such a penetrator can extend through a flexible seal arranged in a side wall or lid of the capacitor housing, so that the capacitor fluid volume is contained in the capacitor housing.

In an alternative embodiment, the capacitor housing comprises a number of perforations to allow passage of fluid into and out of the capacitor housing. In such an embodiment, the pressure is the same at all points within the power supply module, and there is essentially only one main fluid volume surrounding all components. To prevent contamination from passing into and/or out of the capacitor housing, in a further preferred embodiment of the invention a perforation is covered by a barrier with a suitable degree of permeability. For example, a filter mesh may be arranged over a perforation to catch any particles before entering or leaving the capacitor housing.

The power supply module and all components inside the power supply module are preferably realized to be exposed to a pressure in the range of 1 bar to 500 bar (or $1 \times 10^6$ Pa to $5 \times 10^7$ Pa). To this end, the power supply module can be realized as an essentially cylindrical or tubular body, which may also have rounded ends, for containing the pressure-compensated main fluid volume. The power supply module can be realized to connect to another module such as an interface connector of a transformer. For example, an array of power supply modules can "dock" onto one side of such an interface connector.

Generally, the power cells will have an essentially rectangular form to allow straightforward manufacture. However, as indicated above, a power supply module may have a curved wall construction. Therefore, in an example embodiment of the invention, the subsea power supply arrangement comprises a number of electrically insulating shaped or fitted support elements between a power cell arrangement and a first inner surface of the power cell module. The fitted support elements can be realized as a frame. A fitted support element can be curved to match a curved contour of the power cell module. For example, a shaped support element can be arranged to fit into a lower concave surface of the power supply module, and can have an essentially flat upper surface upon which the power cells can rest.

As indicated above, heat dissipation is an important factor to consider in power supply design, and the power cells are generally equipped with heat dissipating elements. It has also been indicated that the heat dissipating elements make physical contact to the wall of the power supply module in an example arrangement, for a more efficient heat transfer. Therefore, in a further preferred embodiment of the invention, the subsea power supply arrangement comprises a spring assembly between a power cell arrangement and a fitted support. For example, the spring assembly can comprise one or more springs or spring-loaded elements that act to press a power cell arrangement upward, so that a heat sink on the upper surface of the power cell is pressed actively against the upper surface of the power supply module.

FIG. 1 shows a simplified diagram of a first embodiment of a subsea power cell arrangement 1 according to the invention, with a capacitor enclosure 10 made of metal and filled with a dielectric fluid such as Midel® 7131 oil, a synthetic ester. The power cell arrangement 1 is connected to an AC input power supply by way of three busbars 13 which connect to a converter unit 12 housed in a metal container 120 that is secured, as indicated by the dotted lines, to a "front end" of the capacitor enclosure 10. The capacitor enclosure 10 encloses a DC-link capacitor, realized for example as a stacked capacitor assembly. The converter unit comprises a rectifier and inverter with semiconductor components such as diodes and IGBTs.

Figure 2:
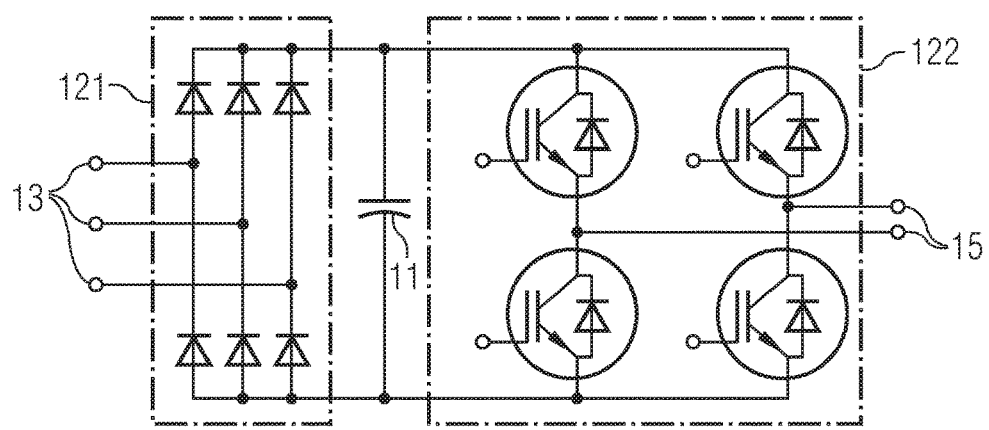
FIG. 2 shows a circuit diagram of an embodiment of a circuit module of the subsea power cell arrangement of FIG. 1.

FIG. 2 shows one realisation of the converter unit 12 and how it may be connected to a capacitor bank 11 and a load. In this diagram, three-phase input delivered by busbars undergoes full-wave rectification in a diode rectifier 121. The rectified voltage is used to charge the DC-link capacitor 11 of the power cell arrangement 1. The DC-link capacitor 11 is connected in turn across the inputs of an inverter 122 comprising four IGBTs in a H-bridge configuration. Control inputs for the gates of the IGBTs are not shown for the sake of clarity. The outputs of the H-bridge 122 can be connected to a load (not shown) by way of busbars 15. Returning to FIG. 1, penetrators 104 are used to electrically connect the rectifier 121 to the DC-link capacitor 11 within the capacitor housing 10. The penetrators 104 pass through a lid 101 of the housing 10 and surrounded by seals 105 to ensure that the housing 10 remains hermetically sealed. The busbars 15 connecting the IGBT outputs to the load can be arranged one on each side of the metal housing 10 as indicated in the diagram. A number of epoxy spacers 130 electrically isolate the metal capacitor housing 10 from the busbars 13, 15.

An additional circuit module 14, for example for controlling and monitoring the status of the power cell, is contained in a metal housing 140 which is mounted in this example embodiment to the base of the capacitor housing 10. This circuit module 14 can be electrically connected to the IGBTs of the inverter using suitable wire connections (not shown).

Figure 3:
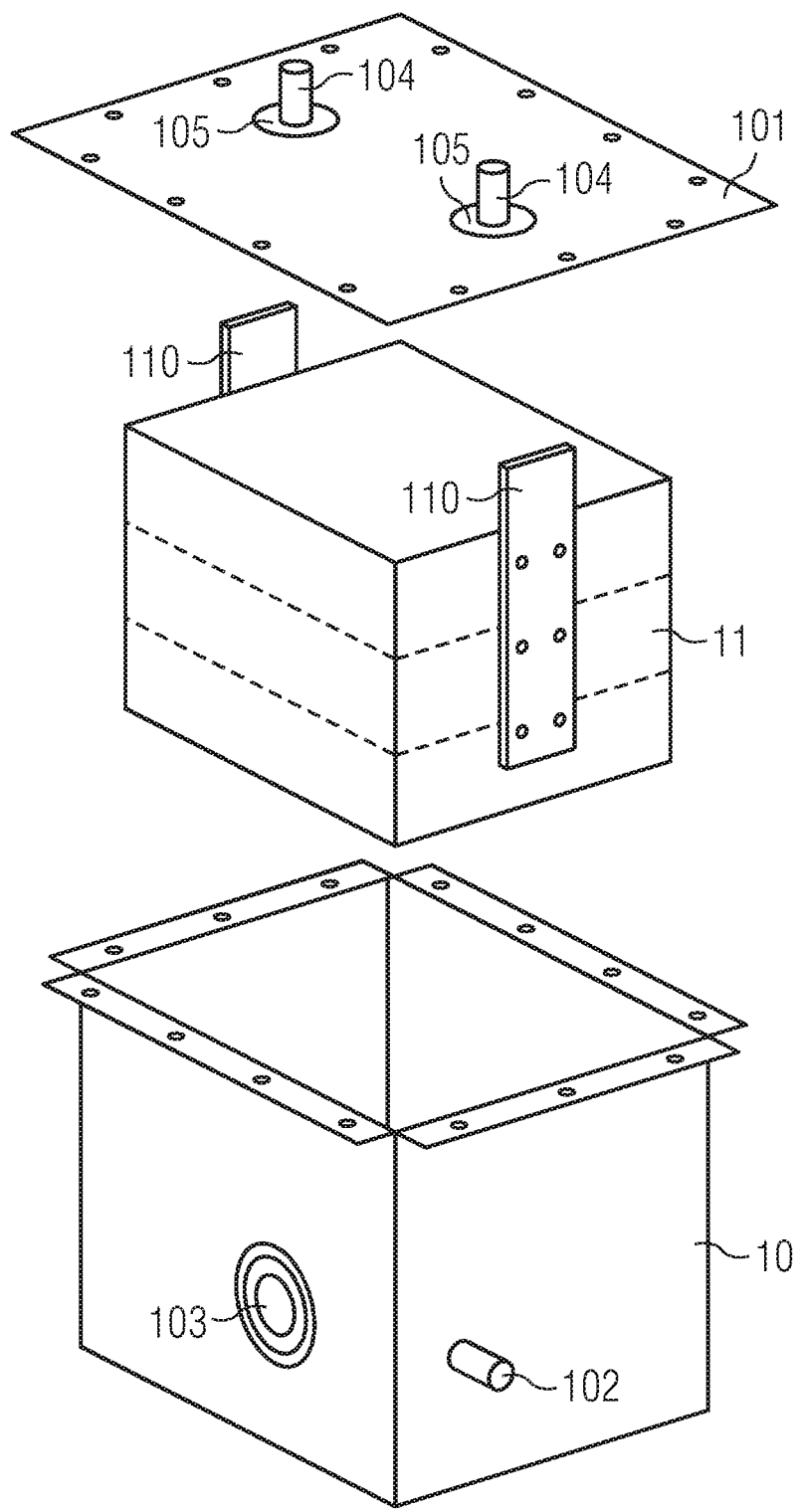
FIG. 3 shows an embodiment of a capacitor enclosure in the power cell arrangement of FIG. 1.

FIG. 3 shows an exploded view of the capacitor enclosure 10 of the power cell arrangement 1 of FIG. 1. The diagram shows a stack 11 of capacitor elements shaped to fit inside the housing 10. Positive and negative poles of the capacitor stack 11 or DC-link capacitor 11 are electrically connected to the penetrators 104 by busbars 110. A seal 105 is arranged about each penetrator 104. In this example, the lid 101 is secured to the body of the housing 10 via fasteners, and a seal can be arranged between lid and body so that the closed housing 10 is hermetically sealed. Once the housing 10 is closed, a dielectric fluid can be introduced into the housing 10 through a fluid inlet 102. Later, the fluid volume can be adjusted if necessary using a volume adjuster 103, which can be realized as a flexible membrane 103 that can move inwards or outwards according to the ambient pressure inside the power supply module containing the power cell arrangement 1.

Figure 4:
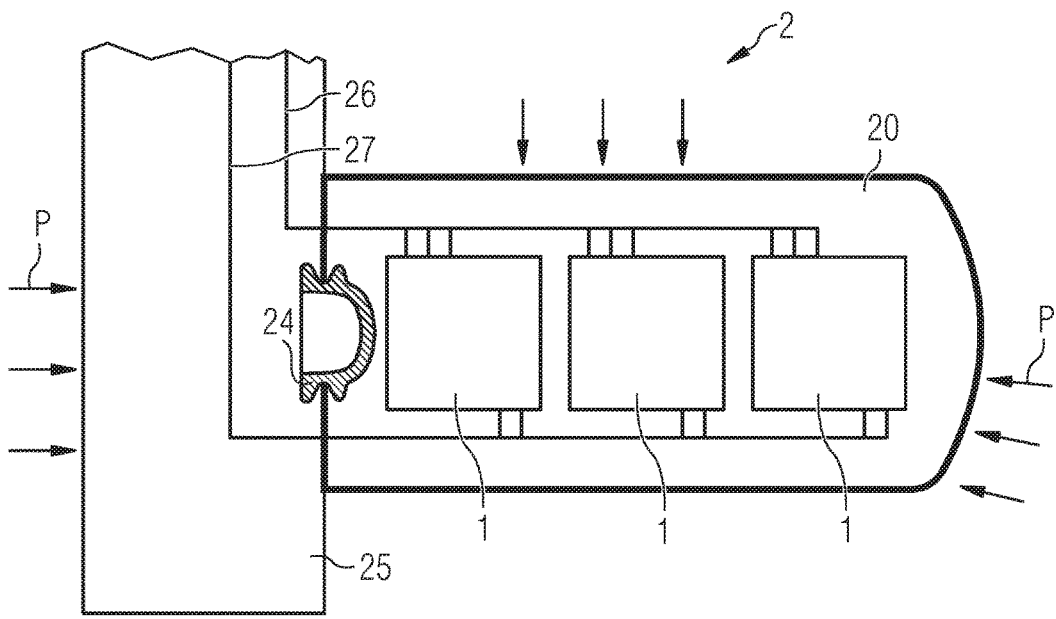
FIG. 4 shows an embodiment of a subsea power supply arrangement according to the invention.

FIG. 4 shows one possible embodiment of a power supply module 20 of a subsea power supply arrangement 2 according to the invention. The diagram only shows relevant elements of the power supply arrangement 2, for example an interface module 25 to which a plurality of power supply modules 20 can be mounted (only one is shown here), and power input and output lines 26, 27. Although not shown in the diagram, the interface module 25 and each power supply module 20 are each filled with a fluid which can be pressurized to approach the pressure P acting on the system from without. For each power supply module 20, a volume compensator 24 is arranged to compensate for pressure differences between the power supply module 20 and the interface module 25. To ensure that the power cells 1 are electrically isolated from each other inside the power supply module 20, epoxy spacers (not shown) can be placed between the power cells 1 or between the power cell 1 and power supply module 20.

In an alternative embodiment of a power supply module, the power cells 1 could be arranged on shelving such as a rack, and the rack might be enclosed in a suitably large and stable enclosure. For example, 18 power cells 1 might be arranged in a 3×6 array or a 2×9 array on shelves of a rack. Here also, epoxy spacers may be used to electrically isolate the power cells 1 from each other and the rack, especially if the rack is made of metal. Alternatively, a supporting structure that carries the power cells 1 can be made of an electrically neutral material.

Figure 5:
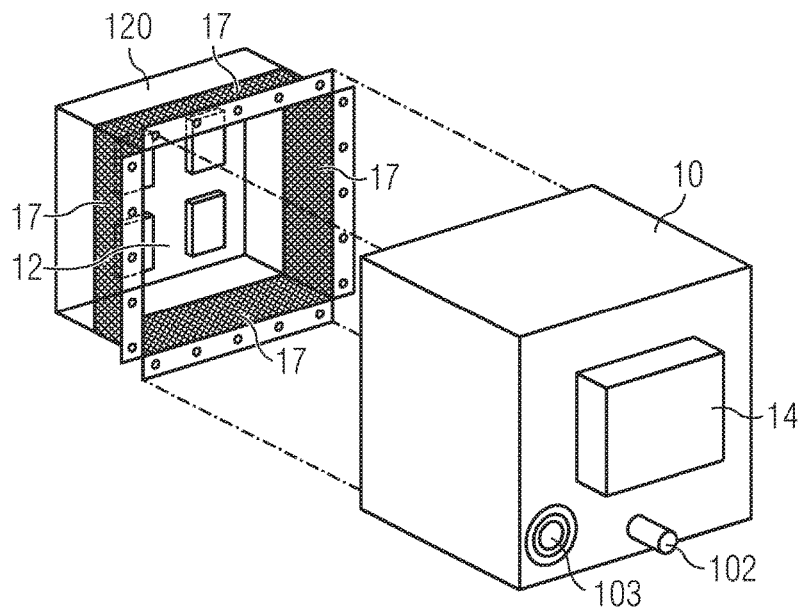
FIG. 5 shows a cross-section taken through the subsea power supply arrangement of FIG. 4.

FIG. 5 shows a further embodiment of a subsea power cell arrangement 1 according to the invention. Here, semiconductor components of the rectifier and inverter contained in the circuit module 12 are protected by a number of filters 17 so that any particles carried in the main fluid volume $F_{main}$ are kept away from the sensitive semiconductor circuitry of the circuit module 12. The filters 17 also ensure that, in the event of failure of any of the circuit components, any resulting particles or contamination are prevented from entering the main fluid volume $F_{main}$ and causing damage elsewhere.

FIG. 6 shows a cross-section taken through the subsea power supply module 20 of FIG. 4. Here, the power supply module 20 is shown to have an essentially circular cross-section. Each power cell 1 is filled with a capacitor fluid volume $F_{cap}$, and surrounded by a main fluid volume $F_{main}$. The pressure inside the subsea power supply module 20 is adjusted to be similar to the pressure P at the depth of the installation level, i.e. at the seabed 3. As explained above, the closed metal housing 10 acts as a barrier to separate the capacitor fluid volume $F_{cap}$ from the main fluid volume $F_{main}$. The semiconductor circuitry in the circuit module, contained in a metal housing 120, is also shown to be surrounded by a fluid volume $F_{cct}$, which may be free to mix with the main fluid volume $F_{main}$, but the presence of a filter membrane 17 ensures that contamination cannot spread between the circuit fluid volume $F_{cct}$ and the main fluid volume $F_{main}$.

The power cells 1 are arranged over a fitted support 21 that is shaped to conform to the shape of the subsea power supply module 20. A heat dissipating element 23 such as a heat sink with fins is mounted to the top of the housing 120 of the circuit module, so that heat can be drawn away. Here also, the heat dissipating element is shaped to conform to the shape of the subsea power supply module 20. The power cell 1 rests on springs 22 which act to press the heat sink 23 against a surface of the power supply module 20, so that an optimal thermal contact can be achieved between heat sink 23 and surface. An electrically insulating and thermally conducting material layer 230 is arranged between the top of the housing 120 and the heat dissipating element 23. This layer 230 can be made of some suitable ceramic material.

FIG. 7 shows a further embodiment of a subsea power cell arrangement 1 according to the invention. Here, the capacitor housing 10H has a number of holes H or perforations H so that a shared fluid volume $F_{shared}$ can pass into and out of the capacitor housing 10H, as indicated by the arrows. A barrier in the form of a filter membrane or a fine mesh can be arranged over the perforations to prevent contamination from passing into or out of the capacitor housing. A subsea installation that uses such capacitor housings 10H can be simpler to install, since it requires only one shared fluid volume $F_{shared}$ and the individual power cells 1 do not require fluid inlets, but any sensitive components of the power cell arrangements are protected from contamination from particles originating from another failed power cell arrangement.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A subsea power supply arrangement comprising:
   a closed power supply module realized to contain a pressure-compensated main fluid volume;
   a number of power cell arrangements arranged in an interior of the closed power supply module, at least one of the number of power cell arrangements including a metal capacitor housing realized to contain a capacitor bank in a fluid, and a barrier between an interior fluid volume of the power cell arrangement and the main fluid volume;
   at least one insulating fitted support, located between a respective one of the number of power cell arrangements and an inner surface of the closed power supply module; and
   a spring arrangement, arranged between one of the number of power cell arrangements and the fitted support.

2. The subsea power supply arrangement of claim 1, wherein at least one of the number of power cell arrangements includes a heat dissipating element arranged to draw heat from a component of the respective at least one power cell arrangement, and wherein the spring arrangement is realized to press the heat dissipating element of the respective at least one power cell arrangement against an inner surface of the power supply module.

3. The subsea power supply arrangement of claim 2, wherein each of the number of power cell arrangements includes a heat dissipating element arranged to draw heat from a component of a respective one of the number of one power cell arrangements, and wherein the spring arrangement is realized to press the heat dissipating element of the respective one of the number of power cell arrangements against an inner surface of the power supply module.

4. The subsea power supply arrangement of claim 1, wherein at least one of the number of power cell arrangements includes a circuit module mounted to the metal capacitor housing of a respective at least one of the number of power cell arrangements, and wherein the circuit module of the respective at least one of the number of power cell arrangements contains a circuit module fluid volume, and wherein the circuit module fluid volume is separated from a surrounding fluid by the barrier.

5. The subsea power supply arrangement of claim 4, wherein each of the number of power cell arrangements includes a circuit module mounted to the metal capacitor housing of a respective one of the number of power cell arrangements, and wherein the circuit module of the respective one of the number of power cell arrangements contains a circuit module fluid volume, and wherein the circuit module fluid volume is separated from a surrounding fluid volume by the barrier.

6. The subsea power supply arrangement of claim 1, wherein at least one of the number of power cell arrangements includes a busbar arrangement mounted to an exterior surface of the metal capacitor housing; and a number of insulating spacer elements between the exterior surface of metal capacitor housing and busbars of the busbar arrangement.

7. The subsea power supply arrangement of claim 6, wherein each of the number of power cell arrangements includes a busbar arrangement mounted to the metal capacitor housing; and a number of insulating spacer elements between the metal capacitor housing and the busbars of the busbar arrangement.

8. The subsea power supply arrangement of claim 1, configured to provide power to a variable speed drive.

9. The subsea power supply arrangement of claim 1, wherein the closed power supply module includes an essentially cylindrical outer wall within which the number of power cell arrangements is housed and for containing the pressure-compensated main fluid volume, configured to connect to an interface connector of a transformer.

10. The subsea power supply arrangement of claim 1, wherein each of the number of power cell arrangements includes a metal capacitor housing realized to contain a capacitor bank in a fluid, and a barrier between an interior fluid volume of the respective power cell arrangement and the main fluid volume.

11. A subsea power cell arrangement, comprising:
a metal capacitor housing configured to contain a capacitor bank in a fluid;
a circuit module mounted to the metal capacitor housing;
a busbar arrangement mounted to an exterior surface of the metal capacitor housing; and a barrier between an interior fluid volume of the subsea power cell arrangement and a main fluid volume of a subsea power supply arrangement;
at least one insulating fitted support, located between the subsea power cell arrangement and an inner surface of an closed power supply module; and
a spring arrangement arranged between the subsea power cell arrangement and the fitted support.

12. The subsea power cell arrangement of claim 11, wherein the barrier comprises a filter membrane.

13. The subsea power cell arrangement of claim 12, wherein the metal capacitor housing is a closed structure to contain the fluid in the metal capacitor housing.

14. The subsea power cell arrangement of claim 13, wherein the metal capacitor housing comprises a volume adjuster to adjust the volume of the capacitor housing fluid volume.

15. The subsea power cell arrangement of claim 11, wherein the metal capacitor housing includes a closed structure to contain a capacitor housing fluid volume.

16. The subsea power cell arrangement of claim 15, wherein the metal capacitor housing comprises a volume adjuster to adjust a volume of the capacitor housing fluid volume.

17. The subsea power cell arrangement of claim 11, wherein the metal capacitor housing comprises a number of perforations to allow passage of fluid into and out of the metal capacitor housing.

18. The subsea power cell arrangement of claim 11, wherein the metal capacitor housing comprises a busbar penetrator to form an electrical contact between a circuit module and the capacitor bank inside the metal capacitor housing.

19. The subsea power cell arrangement of claim 11, wherein the power cell arrangement is configured to withstand a pressure in a range of 300 bar.

20. The subsea power cell arrangement of claim 11, wherein the subsea power cell arrangement is useable in a subsea power supply arrangement that includes:
a closed power supply module realized to contain a pressure-compensated main fluid volume; and
a number of additional power cell arrangements arranged in an interior of the closed power supply module, at least one of the additional of power cell arrangements including a metal capacitor housing realized to contain a capacitor bank in a fluid volume, and a barrier between an interior fluid volume of the power cell arrangement and the main fluid volume.

* * * * *

UNITED STATES PATENT AND TRADEMARK OFFICE
CERTIFICATE OF CORRECTION

PATENT NO.         : 10,039,205 B2
APPLICATION NO.    : 15/103895
DATED              : July 31, 2018
INVENTOR(S)        : Fredrik Gundersen Aarskog It is certified that error appears in the above-identified patent and that said Letters Patent is hereby corrected as shown below:

On the Title Page

Item (73) Assignee should read: SIEMENS AKTIENGESELLSCHAFT, Munich (DE)

Signed and Sealed this
Nineteenth Day of March, 2019

Andrei Iancu
*Director of the United States Patent and Trademark Office*